United States Patent [19]

Barck

[11] 4,126,304
[45] Nov. 21, 1978

[54] CIRCUIT BOARD HOLDER

[76] Inventor: William F. Barck, 82 S. Kalaheo Ave., Kailua, Hi. 96734

[21] Appl. No.: 868,138

[22] Filed: Jan. 9, 1978

[51] Int. Cl.² ............................................. B25B 1/22
[52] U.S. Cl. ...................................... 269/73; 269/97; 269/321 WE
[58] Field of Search ............ 269/73, 97, 249, 321WE; 211/41

[56] References Cited
U.S. PATENT DOCUMENTS

| | | | |
|---|---|---|---|
| 3,173,677 | 3/1965 | Guyot | 269/73 |
| 3,567,210 | 3/1971 | Chevillon | 269/73 |

Primary Examiner—Robert C. Watson
Attorney, Agent, or Firm—Lothrop & West

[57] ABSTRACT

A C-shaped channel mounted on the edge of a table or bench hingeably supports a circuit board clamping member capable of pivoting between a first inclined position in which the mounting side of the circuit board faces upwardly at an angle which enables the user readily to position electronic components in their proper location on the board and a second position in which the reverse or soldering, side of the circuit board faces upwardly in horizontal attitude thereby allowing the user quickly and accurately to solder, wire or otherwise connect the components.

7 Claims, 3 Drawing Figures

CIRCUIT BOARD HOLDER

BACKGROUND OF THE INVENTION

Both the patent literature and the market place provide numerous examples of holders capable of detachably securing circuit boards of the type commonly used by hobbyists, technicians, engineers and scientists in laying out electronic circuits for experimental or other purposes.

Many of the foregoing known devices are complex and expensive, often requiring tensioning mechanisms and positioning clamps necessitating the use of both hands to effect shifting of the perforated board from one position to the other. In short, the present state of the art leaves considerable room for improvement.

SUMMARY OF THE INVENTION

The invention relates to a circuit board holder in which the circuit board can readily be shifted by one hand from a first component-installation position to a second component-connection position.

It is an object of the invention to provide a circuit board holder which lends itself to use either with standard perforated board or micro perforated board.

It is another object of the invention to provide a perforated circuit board holder which is compact in size and economical to buy, yet is efficient and quick in operation.

It is yet a further object of the invention to provide a perforated circuit board holder which dispenses with tensioning jaws and board positioning clamps.

It is another object of the invention to provide a generally improved perforated circuit board holder.

Other objects together with the foregoing, are attained in the embodiment shown in the accompanying drawing and described in the following description.

DETAILED DESCRIPTION OF PREFERRED EMBODIMENT

Figure 1:
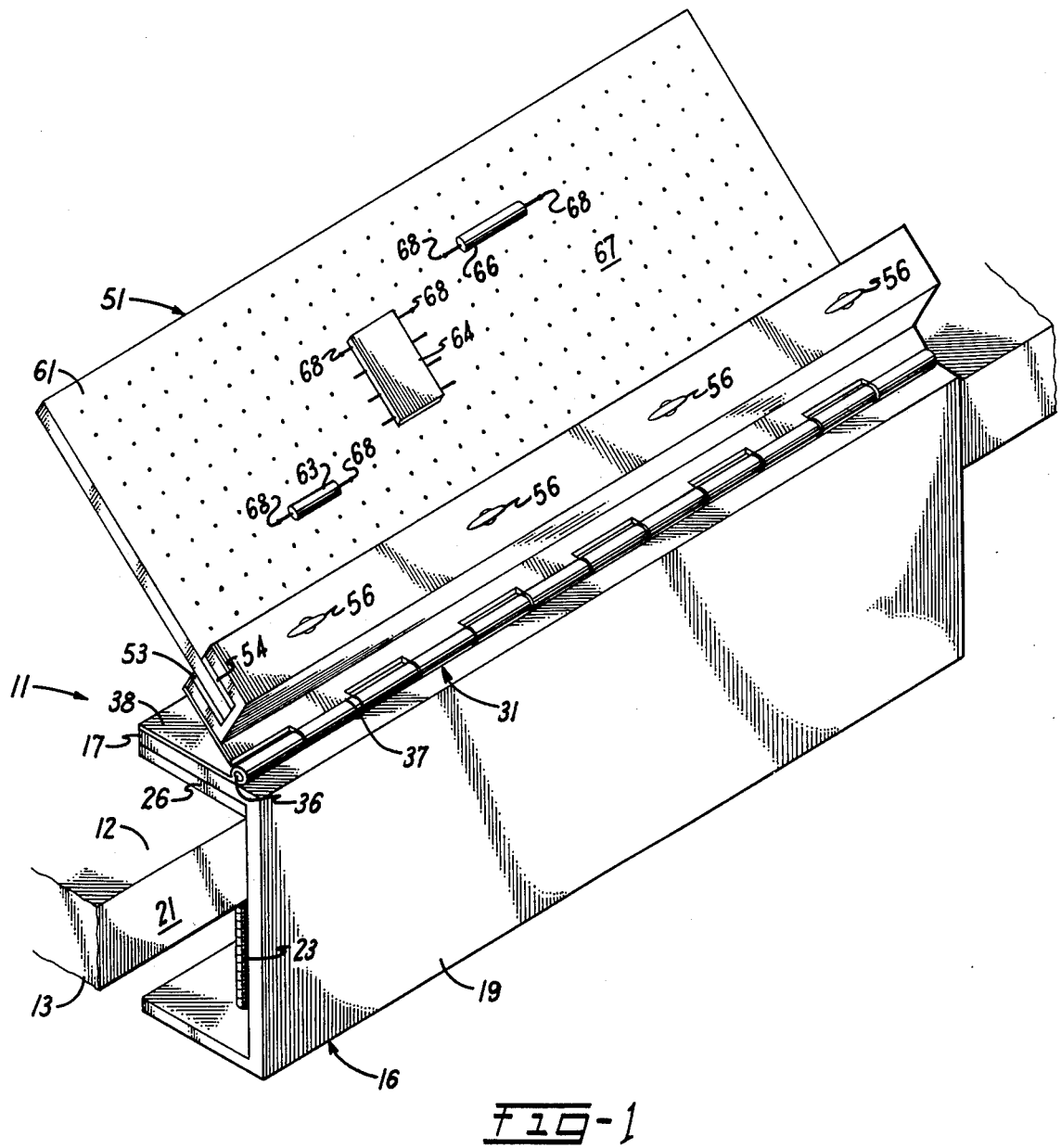
FIG. 1 is a left front perspective view of the perforated circuit board holder clamped to a bench or table, with the board-clamping member tilted to an upward angular position facilitating the installation on the circuit board of various electronic circuit components.

While the circuit board holder of the invention is susceptible of numerous physical embodiments, depending upon the environment and requirements of use, substantial numbers of the herein shown and described embodiment have been made, tested and used, and all have performed in an eminently satisfactory manner.

The circuit board holder of the invention, generally designated by the reference numeral 11, is conveniently supported on the marginal edge 12 of a bench 13, or table, support being provided by an elongated C-shaped in section channel 16 having an upper flange 17, a lower flange 18 and a web 19.

The web 19 is in vertical attitude when the board holder 11 is installed, the web 19 being at least of sufficient height to span the vertical edge surface 21 of the bench 13.

Figure 3:
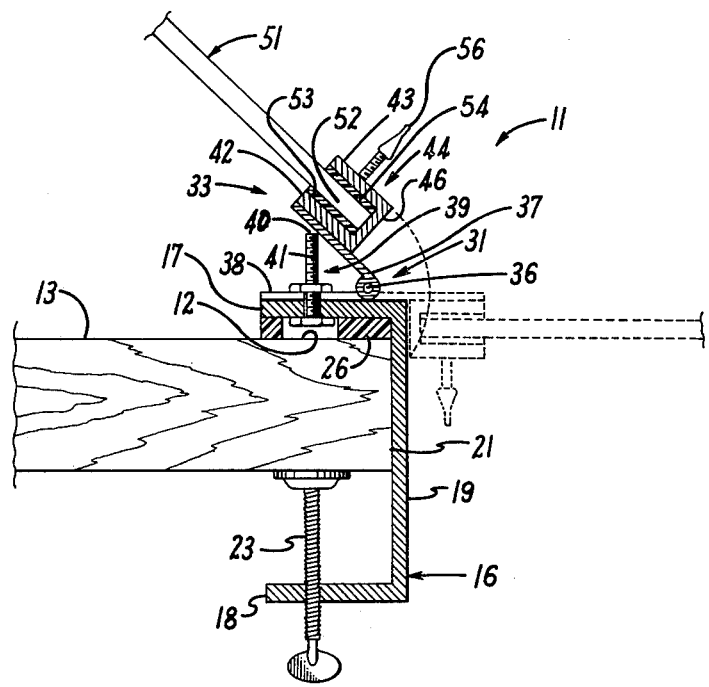

One or more, preferably two, vertically adjustable screw clamps 23 are threadably mounted on the lower flange 18, as appears most clearly in FIG. 3, and serve to secure the channel 16 to the bench or table, as shown. A protective cushion 26 of yieldable material, such as cork, is interposed between the upper flange 17 and the subjacent top surface of the bench 13.

Pivotally mounted on the horizontal upper flange 17, as by a hinge 31, is a circuit board clamping member 33. The hinge 31 is conventional and includes an elongated horizontal hinge pin 36 pivotally connecting a movable hinge plate 37 to a fixed hinge plate 38 attached to the upper flange 17 by one or more, preferably two, threaded fastenings 39.

Figure 2:
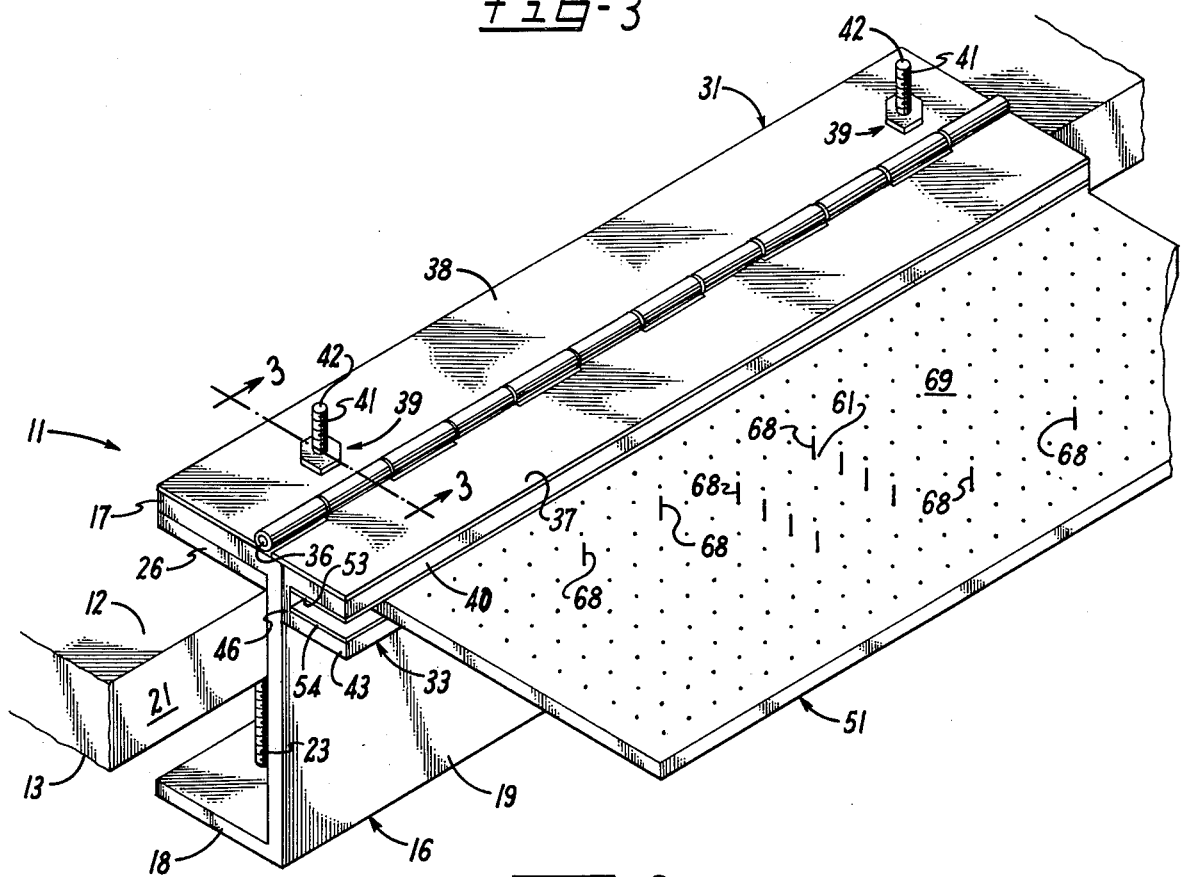
FIG. 2 is a view comparable to FIG. 1, but with the circuit board clamping member positioned in horizontal attitude enabling the user to solder or otherwise connect the conductors extending through the board perforations from the electronic components shown in FIG. 1; and, FIG. 3 is a transverse sectional view, the plane of the section being indicated by the line 3—3 in FIG. 2, the full line showing corresponding to the tilted attitude of the board shown in FIG. 1 and the broken line showing corresponding to the horizontal position of the board appearing in FIG. 2.

The threaded fastenings include a vertically oriented screw 41 having a top end 42 located at a predetermined height above the fixed hinge plate 38 so that when the movable hinge plate 37 is swung from the horizontal attitude shown in FIG. 2 (and in broken line in FIG. 3) to the upward position shown in FIG. 1 (and in full line in FIG. 3) the movable hinge 37 abuts the top end 42 of the vertical screws 41. The screws 41, in other words, serve as a limit stop which positions the movable hinge plate 37 at a predetermined angle.

The predetermined angle can be changed, as desired, by a suitable selection of screw lengths.

The angle assumed by the movable hinge plate 37 in abutment with the limit stop screws 41 is repeated by the flanges 40 and 43 of an elongated C-shaped in section channel 44 including a web 46, the channel 44 being secured by an appropriate adhesive, for example, to the movable hinge plate 37.

As appears most clearly in FIG. 3, the channel 44 partakes of the swinging movement of the movable hinge plate 37.

In turn, a circuit board 51 is transferred between the upwardly inclined attitude shown in FIG. 1 (and in full line in FIG. 3) to the horizontal position illustrated in FIG. 2 (and in broken line in FIG. 3) owing to the fact that the marginal edge 52 of the board 51 is clamped between the two webs 40 and 43 of the channel 44.

A protective strip 53 of yieldable material on the web 40 engages one side of the board edge 52 and a strip 54 of a tough "plastic" material on the web 43 engages the other side of the board edge. Thus, by tightening a plurality of screws 56 threadably engaging the web 43 the "plastic" strip 54 is urged against the interposed board edge 52, the board edge 52 being thereby tightly clamped between the two webs 40 and 43 of the channel.

After the circuit board 51 is thus securely clamped in the channel 44, the board can readily be angularly shifted, as previously described, between the two extreme positions. Gravity holds the board in the upper inclined position, the board being supported from below by the top 42 of the limit stop screws 41. In lower, horizontal position, the web 46 of the channel 44 abuts the web 19 of the channel 16 (see FIGS. 2 and 3).

Many types of circuit boards 51 exist. For present purposes, however, it will be assumed that the circuit board is of the Type A, or standard, perforated board having a plurality of apertures 61 of predetermined size and spacing. As will be recognized, the device will also accommodate perforated boards of the micro type, with smaller openings and spacings, or, in fact, other types of boards including those of the printed circuit type.

OPERATION

Although not limited thereto, many users prefer to install various electronic components 63, 64, and 66, for example, on the upwardly facing surface 67, or mounting side, of the board 51, as appears in FIG. 1 (and in full line in FIG. 3). The various leads 68, or conductors, are inserted through the adjacent apertures 61 so that the ends protrude from the opposite, or soldering, surface 69 of the board.

If desired, the installed components, such as components 63, 64 and 66, can temporarily be held in place by adhesive tape attached to the mounting side 67 of the circuit board.

During installation of the electronic components the board is conveniently held at an angle on the order of 45°.

After installation is completed the board can readily be moved by one hand to the forwardly extending, horizontal attitude (see FIG. 2) so that the conductors 68 extending through the apertures 61 can easily be soldered or otherwise connected.

What is claimed is:

1. A holder for a perforated circuit board having a mounting side and a soldering side, said holder comprising:
   a. a base including an elongated C-shaped in section channel having an upper flange, a web and a lower flange;
   b. means for securing said base to a bench or table along an edge thereof;
   c. an elongated board-clamping member mounted on said upper flange for pivotal movement between a first upper position and a second lower position;
   d. means for clamping the circuit board to said board-clamping member so that the mounting side of the circuit board faces in a substantially upward direction when said board-clamping member is in said first position and the soldering side of the clamping board faces in a substantially upward direction when said board-clamping member is in said second position,
   said board-clamping member including a hinge having a hinge pin oriented parallel to the longitudinal dimension of said channel, said hinge further including a first hinge plate and a second hinge plate each relatively movable on said hinge pin, said first hinge plate being mounted on said upper flange of said channel and said second hinge plate being mounted on said board-clamping member.

2. A circuit board holder as in claim 1 further including a limit stop interposed between said first hinge plate and said second hinge plate in said first position of said clamping member, said limit stop being capable of supporting said clamping member in an inclined attitude in said first position of said clamping member so that a circuit board clamped to said clamping member faces upwardly at an angle on the order of 45°.

3. A circuit board holder as in claim 2 in which said board-clamping member includes a pair of opposed resilient cushions for engagement with the interposed marginal edges of the circuit board.

4. A circuit board holder as in claim 3 in which said channel securing means includes at least a pair of clamping screws threadably mounted on said lower flange of said channel.

5. A circuit board holder as in claim 4 in which said circuit board clamping means includes at least a pair of clamping screws mounted on said board-clamping member.

6. A circuit board holder as in claim 5 in which said clamping member is a C-shaped in section channel and said opposed resilient cushions are mounted on the facing surfaces of the channel flanges.

7. A circuit board holder as in claim 2 which said limit stop is a vertical screw threadably mounted on said first hinge plate, the upper end of said screw being engageable with said second hinge plate in said first position of said clamping member.

* * * * *